United States Patent
Wojewnik

[11] Patent Number: 6,106,303
[45] Date of Patent: Aug. 22, 2000

[54] TRIM PANEL HAVING GROOVES WITH INTEGRALLY FORMED ELECTRICAL CIRCUITS

[75] Inventor: Albert Wojewnik, Royal Oak, Mich.

[73] Assignee: Lear Automotive Dearborn, Inc., Southfield, Mich.

[21] Appl. No.: 09/085,986

[22] Filed: May 27, 1998

[51] Int. Cl.[7] .................................................. H01R 33/00
[52] U.S. Cl. .............................................. 439/34; 29/842
[58] Field of Search ............................. 29/846, 847, 825, 29/829; 174/250, 262, 65 R; 252/512; 439/34

[56] References Cited

U.S. PATENT DOCUMENTS

| | | | |
|---|---|---|---|
| 4,031,268 | 6/1977 | Fairbairn | 427/12 |
| 4,065,197 | 12/1977 | Kuist et al. | 339/17 R |
| 4,836,955 | 6/1989 | Ehrreich | 252/512 |
| 4,848,829 | 7/1989 | Kidd | 296/152 |
| 4,869,670 | 9/1989 | Ueda et al. | 439/34 |
| 5,484,186 | 1/1996 | Van Order et al. | 296/97.5 |
| 5,712,764 | 1/1998 | Baker et al. | 361/690 |
| 5,735,041 | 4/1998 | Zaguskin et al. | 29/857 |
| 5,846,854 | 12/1998 | Giraud et al. | 438/149 |
| 5,950,305 | 9/1999 | Roberts | 29/848 |

FOREIGN PATENT DOCUMENTS

| | | |
|---|---|---|
| 791494A2 | 8/1997 | European Pat. Off. . |
| 3821121A1 | 2/1990 | Germany . |
| 1457805A | 12/1976 | United Kingdom . |
| WO 9503684A1 | 2/1995 | WIPO . |

*Primary Examiner*—Gary F. Paumen
*Assistant Examiner*—Alexander Gilman
*Attorney, Agent, or Firm*—MacMillan, Sobanski & Todd, LLC

[57] ABSTRACT

A vehicle trim panel of electrically non-conductive material is mounted to the interior of a vehicle door assembly. An exterior surface of the panel includes a decorative trim and an interior surface includes at least a first electrical connector and a second electrical connector. The interior surface also includes grooves interconnecting the first and second electrical connectors. A fluent polymer and an electrically conductive metallic powder are integrally deposited and adhered to the grooves of the trim panel to define electrical circuit for electrically connecting the first electrical connector to the second electrical connector. The electrical circuit preferably includes a number of spaced apart circuit traces which feed electrical current between the electrical connectors to a number of electrical components.

16 Claims, 2 Drawing Sheets

TRIM PANEL HAVING GROOVES WITH INTEGRALLY FORMED ELECTRICAL CIRCUITS

BACKGROUND OF THE INVENTION

The subject invention relates to a vehicle trim panel assembly having an electrical circuit integrally molded into grooves. The subject invention also relates to the method of fabricating the trim panel with the electrical circuit.

Vehicles typically have a number of trim panels mounted to different interior surfaces to present a pleasing appearance. One common type of trim panel is a door trim panel mounted to the interior surface of a door assembly. Typically, vehicle door assemblies include spaced apart inner and outer panels defining a cavity for mounting a window, window regulator, speakers and other electrical devices. These devices are installed inside the door cavity through a plurality of access openings provided in the door inner panel.

The door trim panel conceals this interior surface of the door. The door trim panel is conventionally formed of a rigid panel, such as molded plastic or pressed hardboard, covered with a flexible decorative trim material such as cloth, vinyl, leather and/or carpeting. The door trim panel is attached to the door by suitable fasteners which creates a pleasing appearance to the occupant.

The door trim panel also often supports a number of electrical components. These components include, lights, window controls, rear view mirror controls, seat adjustment controls, and speakers. Each of these electrical components requires an individual wiring connector and power supply lead wires. The power supply lead wires for all the electrical components are typically bundled together to create what is commonly called a wire harness. The wire harness must be affixed to the trim panel or to the door to eliminate movement of the wires during operating conditions. As can be appreciated, the mounting and wiring of these electrical components is labor intensive and requires a number of connectors and other electrical parts.

Solutions to this problem have been contemplated by the prior art. Specifically, the prior art has proposed the power supply lead wires be mounted, molded, etched, printed, or otherwise affixed to a separate rigid board material. The rigid board is in turn mounted in some fashion to either the trim panel or the door or both. Hence, in these proposals, the door assembly includes the door itself, a rigid board, and then the trim panel. These proposals, however, likewise have a number of deficiencies. One deficiency is the same as with the loose bundle of wires. This solution still requires a significant amount of intensive manual labor to mount the wires to the board, mount the connectors to the board, and then mount the board itself to either the trim panel or the door. Further, additional connectors must be mounted on the board to electrically connect the connectors from the door to the connectors on the trim panel.

SUMMARY OF THE INVENTION

In one embodiment, the subject invention includes a trim panel of electrically non-conductive material having an exterior surface and an interior surface. The exterior surface provides a decorative trim and the interior surface includes electrical connectors. The interior surface also includes at least one groove interconnecting one of the electrical connectors to another electrical connector. A binding agent and an electrically conductive material are integrally deposited and adhered to the groove of the trim panel to define an electrical circuit for electrically connecting the electrical connectors and/or components.

The subject invention also includes a method of fabricating a vehicle trim panel with an integral electrical circuit. The method includes depositing the binding agent and the electrically conductive material within the groove of the trim panel. Preferably the binding agent is a liquid polyurethane. The binding agent and the material are allowed to cure, such that they adhere and harden within the groove of the trim panel.

The invention thus provides a vehicle trim panel having an integrally molded electrical circuit for interconnecting any number of electrical devices. The trim panel of the subject invention can be efficiently manufactured and may not require any additional connectors or components. In other words, all of the parts necessary to electrically connect an electrically operated component to an electrical supply are included within the trim panel itself. These parts include the connectors and the electrical circuit which are all preferably integrally molded into the trim panel. Some of the connectors, however, may need to be separately affixed to the trim panel.

BRIEF DESCRIPTION OF THE DRAWINGS

Other advantages of the present invention will be readily appreciated as the same becomes better understood by reference to the following detailed description when considered in connection with the accompanying drawings wherein.

DETAILED DESCRIPTION OF THE PREFERRED EMBODIMENT

Figure 1:
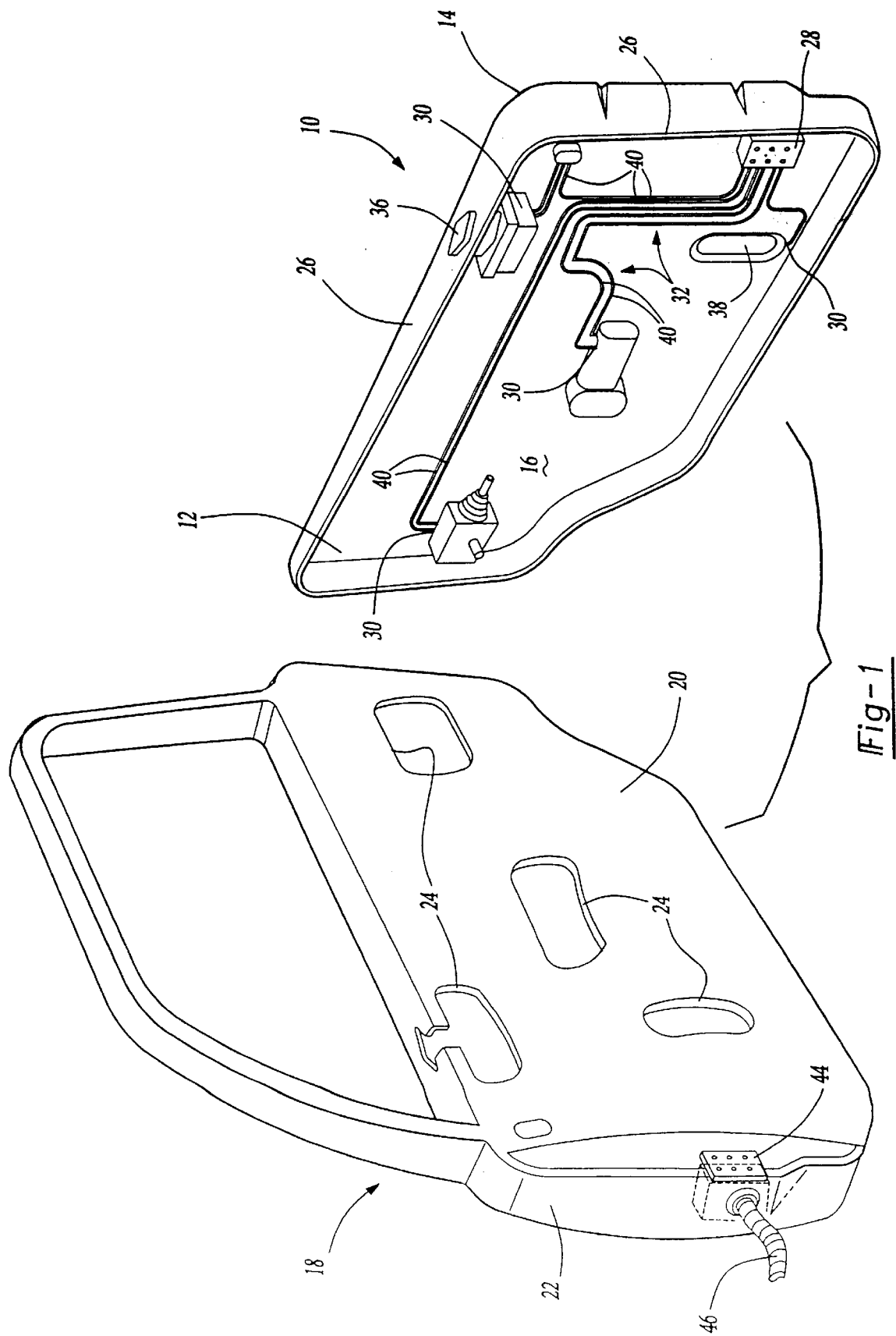
FIG. 1 is a perspective view of a trim panel assembly in spaced relationship to a vehicle door assembly.

A vehicle trim panel assembly is generally shown at 10 in FIG. 1. The trim panel assembly 10 comprises a trim panel 12 of electrically non-conductive material having an exterior surface 14 and an interior surface 16. The trim panel 12 of the preferred embodiment is a automotive door trim panel 12 which mounts to a vehicle door assembly, generally shown at 18. As appreciated by those skilled in the art the trim panel 12 of the subject invention may be any type of trim panel associated with a vehicle without deviating from the scope of the subject invention. Other types of trim panels include trunk panels, quarter panels, rear package trays, headliners, instrument panels, garnish moldings, and console panels, among others.

The vehicle door assembly 18 includes spaced apart inner 20 and outer 22 metal panels defining a cavity (not numbered) for mounting a window, window regulator, speakers, and other electrical devices (not shown). A plurality of access openings 24 are provided in the inner panel 20 to allow access into the cavity of the door assembly 18. The door trim panel 12 is utilized to conceal this interior surface 20 of the vehicle door 18.

The door trim panel 12 is preferably formed of a molded plastic such as polypropylene. As appreciated by those skilled in the art, the trim panel 12 may be fabricated of wood fibers, polyurethane, solid molded vinyl, expanded polyurethane foam, any combination thereof or any other suitable rigid electrically non-conductive material. The exterior surface 14 of the trim panel 12 includes a decorative surface. Specifically, the trim panel 12 may be covered with a flexible decorative trim material 26 such as cloth, vinyl, leather, and/or carpeting. The trim panel 12 is attached to the vehicle door 18 by suitable fasteners (not shown) as are well known in the art.

The interior surface 16 of the trim panel 12 includes at least one groove, generally shown at 32. A first electrical connector 28 is placed at one end of a groove 32. A second electrical connector 30 is placed at the other end of the same groove 32. As shown in the preferred embodiment there are a number of second electrical connectors 30. These electrical connectors 28, 30 can be of any suitable design or configuration without deviating from the scope of this invention. In fact, the electrical connectors 28, 30 may simply be a projecting portion of the trim panel 12. The interior surface 16 of the trim panel 12 also supports a number of electrical components. These components can include, window controls, rear view mirror controls 36, seat adjustment controls, and speakers 38. Each of these electrical components 36, 38 typically have an associated individual second electrical connector 30.

As shown in FIG. 1, the vehicle door assembly 18 also includes at least one corresponding electrical connector 44. A vehicle wire harness 46 is coupled to the electrical connector 44 of the door assembly 18. Hence, the electrical connector 44 of the door assembly 18 is the main power supply source for all the components within the vehicle door 18 and the trim panel 12. At least one of the first 28 and second 30 electrical connectors of the trim panel 12 is electrically connected to the electrical connector 44 of the door assembly 18. Specifically, the first electrical connector 28 of the trim panel 12 is electrically connected to the electrical connector 44 of the door assembly 18 and the second electrical connector 30 of the trim panel 12 is electrically connected to one of the electrically operated components 36, 38.

Figures 2, 3:
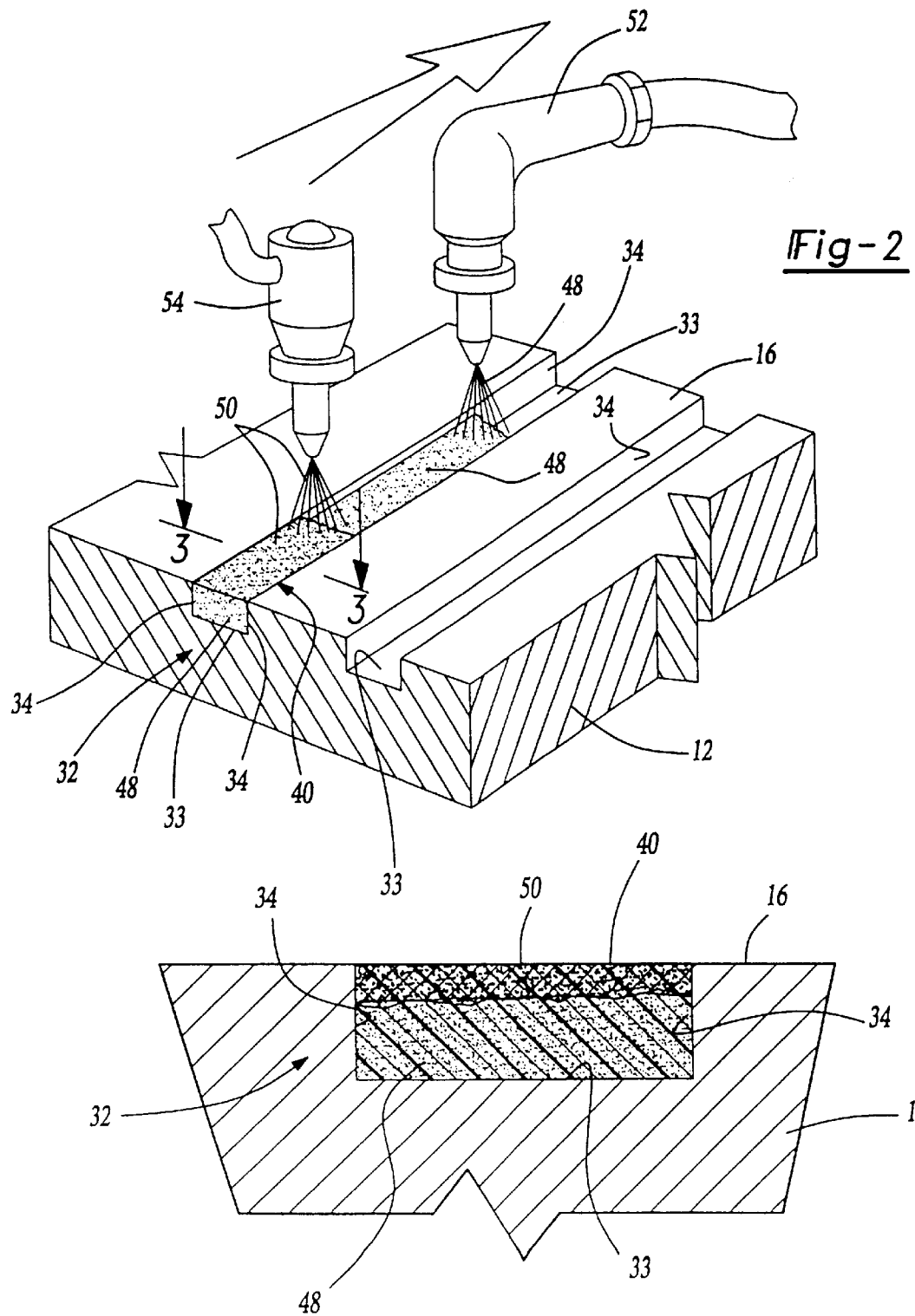
FIG. 2 is a partially broken perspective view of the trim panel during the method of fabrication.
FIG. 3 is a cross-sectional view taken along line 3—3 of FIG. 2.

As best shown in FIG. 2, the groove 32 includes a bottom 33 and a pair of sides 34 extending upwardly from the bottom 33. In the preferred embodiment, the groove 32 has a substantially rectangular configuration. As appreciated by those skilled in the art, the groove 32 may be of any design, depth, or width without deviating from the scope of the subject invention.

A binding agent 48 and an electrically conductive material 50 are integrally deposited and adhered to the groove 32 of the trim panel 12 to define an electrical circuit 40. The electrical circuit 40 comprises a plurality of spaced apart circuit traces 40. The electrical circuit traces 40 electrically connect the first electrical connectors 28 to the second electrical connectors 30. In the preferred embodiment, the binding agent 48 is further defined as a fluent polymer 48. Even more preferably, the fluent polymer 48 is a liquid polyurethane. Preferably, the binding agent 48 is cohesive with the trim panel 12. In other words, the binding agent 48 is of a like composition to the trim panel 12 such that there is an attraction between the intermolecular forces. In fact the binding agent 48 may be formed of the same material as the trim panel 12.

As appreciated by those skilled in the art, the binding agent 48 may be of any suitable composition so long as the material 50 can be adequately retained within the groove 32 of the trim panel 12. Also, the binding agent 48 should be of a composition such that the exterior surface 14 of the trim panel 12 is not effected by the deposition of the electrical circuit trace 40 on the interior surface 16. Other suitable compositions may include polypropylene, any type of adhesive, or the like. In fact, the groove 32 may be designed in such a fashion as to mechanically lock the binding agent 48 to the trim panel 12. The key is that the binding agent 48 is fixed in some fashion to the trim panel 12.

As shown in FIG. 3, the binding agent 48 is disposed along the bottom 33 of the groove 32 and at least a portion of the sides 34 of the groove 32. The electrically conductive material 50 is disposed onto the binding agent 48 between the sides 34 of the groove 32. The material 50 is fixed in some fashion to the binding agent 48 which in turn retains the material 50 within the groove 32 of the trim panel 12. Preferably, the electrically conductive material 50 is at least partially immersed within the binding agent 48. As discussed above, the binding agent 48 may be mechanically locked to the trim panel 12 wherein the material 50 may be wedged between the binding agent 48 and the trim panel 12.

In the preferred embodiment, the electrically conductive material 50 is further defined as an electrically conductive metallic powder and more preferably as a copper powder. As appreciated by those skilled in the art, other types of material, such as zinc, may be utilized so long as the material has sufficient conductivity characteristics and will become fixed within the groove 32. The binding agent 48 is applied through a suitable agent nozzle assembly 52. Similarly, the material 50 is applied through a suitable material nozzle assembly 54. Depositing similar agents and materials is known in the art, but not in combination, and not onto trim panels to form a number of circuit traces.

As discussed above, the electrical circuit 40 formed within the trim panel 12 comprises a plurality of spaced apart circuit traces 40 or strips of conductive material 50. For illustrative purposes, six traces are shown in FIG. 1, however, any number of traces 40 may be utilized as deemed necessary. As appreciated by those skilled in the art, most electrical components require at least two input supply wires, i.e., a ground wire and an input wire carrying an electrical current. Further, if the electrical connector is a switch, there may be at least one output wire also carrying an electrical current. Hence, the number of traces 40 formed in the electrical circuit trace 40 will depend on the number and type of electrical components used. Each individual trace 40 can vary in width and thickness to accommodate varied gauges and to customize resistivity. If a standard groove size is used, then as the trace 40 is reduced in size more binding agent 48 will be required and similarly as the trace 40 increases in size less binding agent 48 will be utilized. This provides benefits in using standard groove sizes for different voltage/current applications.

Accordingly, every circuit trace 40 of the electrical circuit 40 begins at the first electrical connector 28 and travels along the trim panel 12 to the designated electrical component 36, 38. Hence, the electrical current travels to or from the vehicle wire harness 46, through the electrical connector 44 of the door assembly 18, through the first electrical connector 28 of the trim panel 12, through the electrical circuit trace 40, through the second electrical connector 30 of the trim panel 12, and finally into the designated electrical component 36, 38.

As discussed above, the trim panel 12 is mounted to the inner panel 20 of the vehicle door assembly 18. To prevent a short circuit, the electrical circuit 40 of the trim panel 12 is preferably spaced some distance from the door assembly 18. Further, an insulative coating (not shown) or similar material may be applied over the electrical circuit 40 to create a protective moisture barrier between the door assembly 18 and the trim panel 12.

Referring to FIG. 2, the method of fabricating the trim panel 12 with the electrical circuit 40 is disclosed in greater detail. For illustrative purposes, only a portion of the trim panel 12 and electrical circuit 40 are shown.

The method of fabricating the vehicle trim panel 12 with the electrical circuit 40 comprises the steps of providing the trim panel 12 having the interior surface 16, the exterior surface 14 with the decorative appearance, and spaced first 28 and second 30 electrical connectors. A plurality of grooves 32 are formed within the interior surface 16 of the trim panel 12 between the first 28 and second 30 electrical connectors. A binding agent 48 is deposited within the groove 32. As discussed above, preferably the binding agent 48 is a fluent polymer 48 and more preferably the binding agent 48 is a liquid polyurethane. As also discussed above, the binding agent 48 may be of any suitable composition. An electrically conductive material 50 is deposited within the groove 32 and at least partially abuts the binding agent 48 to retain the material 50 within the groove 32 and define the electrical circuit 40 between the first 28 and second 30 electrical connectors. Preferably, the material 50 is an electrically conductive metallic powder such as copper powder.

The binding agent 48 is then cured to adhere and harden to the trim panel 12, whereby the electrical circuit 40 electrically connects the first 28 and second 30 connectors. The curing of the binding agent 48 is defined as allowing the liquid or otherwise fluent material to harden into a solid state.

As discussed above, there will be a plurality of spaced apart traces 40. As can be appreciated, the location of the spaced apart traces 40 on the trim panel 12 corresponds to the position of the grooves 32.

The preferred method of depositing the binding agent 48 and material 50 is further defined by first depositing the binding agent 48 within the groove 32 of the trim panel 12 followed by the depositing of the electrically conductive material 50 onto the binding agent 48 such that the material 50 is at least partially immersed within the binding agent 48. In other words, the binding agent 48 is first applied to the groove 32 and then the material 50 is applied over the binding agent 48 as shown in FIG. 2. As discussed above, the material 50 may be applied first to the groove 32 or may be applied between multiple layers of binding agent 48 without deviating from the scope of the overall invention.

The overall method of fabricating the door trim panel 12 is further defined by mounting the trim panel 12 to the vehicle door assembly 18. The method of mounting the trim panel 12 to the door assembly 18 is further defined by electrically connecting at least one of the first 28 and second 30 electrical connectors of the trim panel 12 with the electrical connector 44 of the door assembly 18. Specifically, the method of mounting the trim panel 12 to the door assembly 18 is further defined by electrically connecting the first electrical connector 28 of the trim panel 12 with the electrical connector 44 of the door assembly 18 and electrically connecting the second electrical connector 30 of the trim panel 12 with one of the electrically operated components 36, 38.

The invention has been described in an illustrative manner, and it is to be understood that the terminology which has been used is intended to be in the nature of words of description rather than of limitation. Obviously, many modifications and variations of the present invention are possible in light of the above teachings. It is, therefore, to be understood that within the scope of the appended claims the invention may be practiced otherwise than as specifically described.

What is claimed is:

1. A method of fabricating a vehicle trim panel with an electrical circuit comprising the steps of:

providing a trim panel having an interior surface, an exterior surface with a decorative appearance, and spaced first and second electrical connectors;

forming at least one groove within said interior surface of said trim panel between said first and second electrical connectors;

depositing a binding agent within said groove of said trim panel;

depositing a fluent electrically conductive material within said groove and at least partially abutting said material with said binding agent to retain said material within said groove and define said electrical circuit between said first and second electrical connectors.

2. A method as set forth in claim 1 wherein said depositing of said binding agent is further defined by depositing a fluent polymer within said groove.

3. A method as set forth in claim 1 wherein said depositing of said electrically conductive material is further defined by depositing an electrically conductive metallic powder within said groove.

4. A method as set forth in claim 1 wherein said depositing of said binding agent and material is further defined by first depositing said binding agent within said groove followed by said depositing of said electrically conductive material onto said binding agent such that said material is at lest partially immersed within said binding agent.

5. A method as set forth in claim 1 further including curing said binding agent to adhere and harden to said trim panel whereby said electrical circuit is electrically conductive between said first and second connectors.

6. A method as set forth in claim 1 further including mounting said trim panel to a door assembly.

7. A method as set forth in claim 6 wherein said mounting of said trim panel to said door assembly is further defined by electrically connecting at least one of said first and second electrical connectors of said trim panel with an electrical connector of said door assembly.

8. A vehicle trim panel comprising:

a trim panel of electrically non-conductive material having an exterior surface and an interior surface, a groove formed in said interior surface of said trim panel, a groove formed in said interior surface of said trim panel, a first electrical connector at one end of said trim panel groove, a second electrical connector at an other end of said trim panel groove, a binding agent disposed within said trim panel groove, and a fluent electrically conductive material disposed within said groove of said trim panel above and adjacent to said binding agent and electrically connecting said first electrical connector to said second electrical connector, said binding agent adhering said electrically conductive material to said trim panel, whereby said electrically conductive material forms a single electrically conductive trace between said first and second electrical connectors.

9. An assembly as set forth in claim 8 wherein said electrically conductive material is an electrically conductive metallic powder.

10. An assembly as set forth in claim 8 wherein said electrical circuit comprises a plurality of spaced apart circuit traces integrally formed within said trim panel.

11. An assembly as set forth in claim 8 wherein said binding agent is a fluent polymer.

12. An assembly as set forth in claim 11 wherein said fluent polymer is a liquid polyurethane.

13. An assembly as set forth in claim 11 wherein said interior surface of said trim panel is formed of a substantially similar material as said fluent polymer.

14. An assembly as set forth in claim 8 wherein said groove includes a bottom and a pair of sides extending upwardly from said bottom.

15. An assembly as set forth in claim 14 wherein said binding agent is disposed along said bottom of said groove and at least a portion of said sides of said groove of said trim panel and said electrically conductive material is disposed onto said binding agent between said sides of said groove.

16. An assembly as set forth in claim 15 wherein said electrically conductive material is at least partially immersed within said binding agent.

* * * * *